United States Patent
Ding et al.

(10) Patent No.: US 10,645,735 B2
(45) Date of Patent: May 5, 2020

(54) ENHANCED DATA RATE LOW ENERGY WIRELESS COMMUNICATIONS

(71) Applicant: Avago Technologies International Sales Pte. Limited, Singapore (SG)

(72) Inventors: Shawn Ding, San Diego, CA (US); Chikan Kwan, San Diego, CA (US); Guoxin Xie, San Diego, CA (US); David Lee Recker, Sunnyvale, CA (US); Brandon B. Bae, San Diego, CA (US); Hea Joung Kim, Irvine, CA (US); Seema B. Anand, Irvine, CA (US); Yuan Zhuang, San Diego, CA (US); Siukai Mak, San Diego, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 102 days.

(21) Appl. No.: 15/921,422

(22) Filed: Mar. 14, 2018

(65) Prior Publication Data
US 2018/0270876 A1 Sep. 20, 2018

Related U.S. Application Data

(60) Provisional application No. 62/471,520, filed on Mar. 15, 2017.

(51) Int. Cl.
*H04W 76/10* (2018.01)
*H04W 8/00* (2009.01)
(Continued)

(52) U.S. Cl.
CPC ....... *H04W 76/10* (2018.02); *H03M 13/2906* (2013.01); *H04L 1/0058* (2013.01); *H04L 5/0055* (2013.01); *H04L 27/18* (2013.01); *H04W 8/005* (2013.01); *H04L 1/0041* (2013.01); *H04L 1/0059* (2013.01); *H04L 5/0007* (2013.01); *H04W 4/80* (2018.02); *H04W 24/08* (2013.01)

(58) Field of Classification Search
CPC ..... H04W 76/10; H04W 8/005; H04W 24/08; H04W 4/80; H04L 27/18; H04L 1/0058; H04L 1/0059; H04L 1/0041; H04L 5/0007; H04L 5/0055; H03M 13/2906
See application file for complete search history.

(56) References Cited

U.S. PATENT DOCUMENTS 6,628,943 B1 *  9/2003  Agrawal ........... H04L 29/06027
                                                                           455/432.1
9,888,336 B1 *  2/2018  Stamatakis ............. H04W 4/70
(Continued)

*Primary Examiner* — Guy J Lamarre
(74) *Attorney, Agent, or Firm* — Foley & Lardner LLP

(57) ABSTRACT

In some aspects, the disclosure is directed to methods and systems for an enhanced data rate, low energy wireless communication. Devices may communicate over predetermined wireless bands such as the 2.4 GHz and 5 GHz ISM bands, using π/4-differential quadrature phase shift keying, with physical layer rates of 1, 2, 4, 8 Mbps or higher. Symbol timing may be at any frequency, and may be 256 ns in some implementations. In some implementations, to extend device battery life, devices may use a low latency reconnect mechanism allowing frequent hibernation or shutdown of transmitters and/or carriers.

20 Claims, 13 Drawing Sheets

(51) Int. Cl.

| | |
|---|---|
| *H04L 27/18* | (2006.01) |
| *H04L 1/00* | (2006.01) |
| *H03M 13/29* | (2006.01) |
| *H04L 5/00* | (2006.01) |
| *H04W 24/08* | (2009.01) |
| *H04W 4/80* | (2018.01) |

(56) References Cited

U.S. PATENT DOCUMENTS

| | | | |
|---|---|---|---|
| 2007/0141985 A1* | 6/2007 | Parkkinen | H04W 72/0413 |
| | | | 455/41.2 |
| 2013/0136083 A1* | 5/2013 | Yin | H03M 13/6525 |
| | | | 370/329 |
| 2015/0072724 A1* | 3/2015 | Janovskiy | H04B 7/00 |
| | | | 455/550.1 |
| 2017/0251387 A1* | 8/2017 | Rossebo | H04W 24/06 |
| 2018/0338344 A1* | 11/2018 | Gustafsson | H04L 5/0055 |

* cited by examiner

| Header | | | | | | | |
|---|---|---|---|---|---|---|---|
| PDU Type (4 bits) | ChSel (1 bit) | RFU (1 bit) | TxAdd (1 bit) | RxAdd (1 bit) | CP (1 bit) | CI (2 bits) | Payload Len (8 bits) | HEC (8 bits) |

Advertising Packet header 260

*Fig. 2D*

| Input bit from the Conn FEC Encoder | Output bit pattern from the Mapper | | |
|---|---|---|---|
| | S=2 | S=4 | S=8 |
| 0 | 0 | 01 | 0011 |
| 1 | 1 | 10 | 1100 |

ENHANCED DATA RATE LOW ENERGY WIRELESS COMMUNICATIONS

RELATED APPLICATIONS

The present application claims the benefit of and priority to U.S. Provisional Patent Application No. 62/471,520, entitled "Enhanced Data Rate Low Energy Wireless Communications," filed Mar. 15, 2017, the entirety of which is incorporated by reference herein.

FIELD OF THE DISCLOSURE

This disclosure generally relates to systems and methods for wireless data transmission. In particular, this disclosure relates to systems and methods for providing a low-energy, enhanced data rate wireless protocol.

BACKGROUND OF THE DISCLOSURE

The current Bluetooth specification (BT 5.0) only supports a maximum data rate of 3 Mbps (megabits per second) in BR (basic rate) or EDR (enhanced data rate) protocols or modes, and only supports a maximum of 2 Mbps in the low energy (LE) protocol. These data rates are either too low to support new applications such as 3D or multi-channel high resolution audio, or take up too much air time. For example, the use of some applications such as high fidelity music streaming over Bluetooth may require significant transmission time, interfering with other wireless protocols and technologies utilizing the same frequencies, such as 802.11 (WiFi), ZigBee, or Long Term Evolution (LTE) cellular networks utilizing the 2.4 GHz industrial, scientific, and medical (ISM) radio bands. In particular, Bluetooth LE may have difficulty supporting streaming audio because of its lower data rate, despite having a more efficient data packet structure than some other protocols.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIGS. 2D and 2E are diagrams of headers for different types of packets for an embodiment of an enhanced data rate low energy wireless protocol;

The details of various embodiments of the methods and systems are set forth in the accompanying drawings and the description below.

DETAILED DESCRIPTION

The following IEEE standard(s), including any draft versions of such standard(s), are hereby incorporated herein by reference in their entirety and are made part of the present disclosure for all purposes: IEEE P802.11n™; and IEEE P802.11ac™. Although this disclosure may reference aspects of these standard(s), the disclosure is in no way limited by these standard(s).

Basic rate (BR) and enhanced data rate (EDR) Bluetooth supports a maximum data rate of 3 Mbps (megabits per second), and only supports a maximum of 2 Mbps in the low energy (LE) protocol, which may be either too low to support high-data rate applications, or may take up too much air time, negatively impacting co-channel uses by other protocols, such as 802.11 (WiFi), ZigBee mesh networking, or cellular. In order to take less air time to allow adequate time for other co-channel protocols to do their intended work as well as to be able to support applications that demand more bandwidth, an enhanced data rate LE transport is discussed herein.

Figure 1:
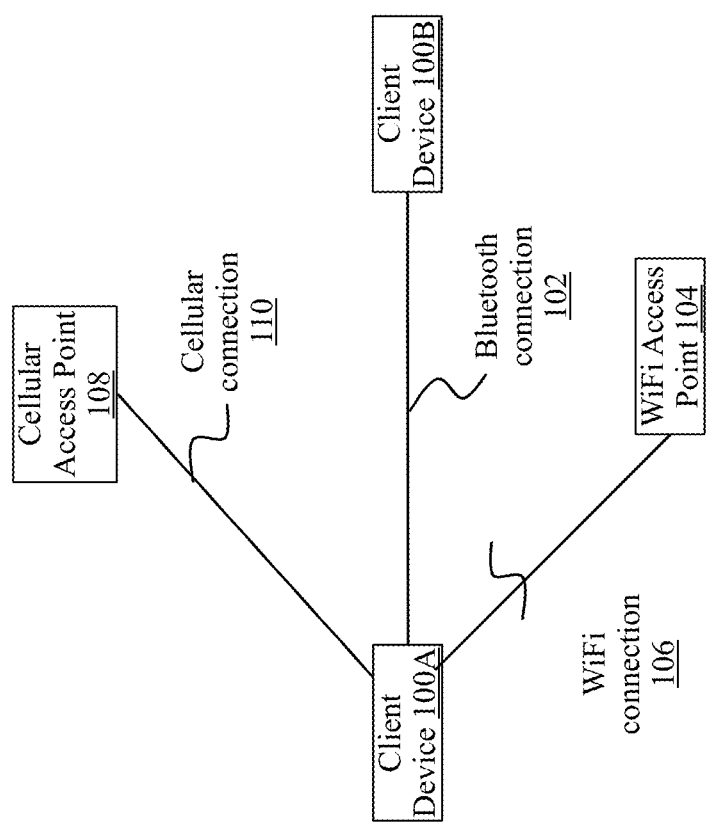
FIG. 1 is a block diagram depicting an embodiment of a network environment utilizing multiple wireless communications interfaces.

For example, FIG. 1 is a block diagram depicting an embodiment of a network environment utilizing multiple wireless communications interfaces. As shown, a first client device 100A may communicate with other devices or access points via a variety of connections. For example, the client device 100A may communicate with another client device 100B via a Bluetooth connection 102; may communicate with a WiFi access point 104 via a WiFi connection 106; and may communicate with a cellular access point 108 via a cellular connection 110. The client device 100A may comprise any type and form of client device, such as a smart phone, tablet computing device, wearable computing device, laptop computing device, portable computing device, desktop computing device, workstation, server, appliance, home automation device, media device, video game console, automotive device, or any other type and form of device. For example, in one implementation, client device 100A may comprise a smart phone communicating via Bluetooth with wireless headphones 100B, also connecting to a WiFi access point 104, and connected to a cellular network via a cellular tower or cellular equipment (e.g. macrocell, picocell, etc.) 108. In another implementation, client device 100A may comprise a video game console communicating with a controller 100B via Bluetooth, as well as a WiFi access point 104.

In many implementations, connections 102, 106, 110 may be via the same band or channels, such as the 2.4 GHz ISM band. Such connections may cause interference if not synchronized or temporally distributed, with each connection utilizing a shared channel for a period.

The systems and methods described herein address these issues by providing an enhanced data rate, low-energy (ELE) wireless communication protocol in the 2.4 GHz space as well as the 5 GHz space (e.g. 5150 MHz-5925 MHz). The ELE protocol may include a 4 MHz channel width in many embodiments, with an inter-channel spacing of 4 MHz to avoid interference. Various embodiments may utilize a symbol rate of 4 million symbols per second (Msps) with differential quadrature phase shift keying (DQPSK), and may provide physical layer rates of 1, 2, 4, 8 Mbps or higher. Symbol timing may be at any frequency, and may be 256 ns in some implementations. In some embodiments, π/4-DQPSK may be used (e.g. with two constellations at a π/4 offset, providing 8 state positions). In other implementations, other encoding schemes may be used (e.g. QPSK, π/4-QPSK, FQPSK, SOQPSK, QAM, etc.). In some implementations, to extend device battery life, devices may use a low latency reconnect mechanism allowing frequent hibernation or shutdown of transmitters and/or carriers. Power outputs in various implementations may be from 0.01 milliwatts (mW) or −20 dBm (decibel-milliwatts), to 100 mW or +20 dBm. Bit ordering may be big endian or little endian in various implementations.

Figure 2A:
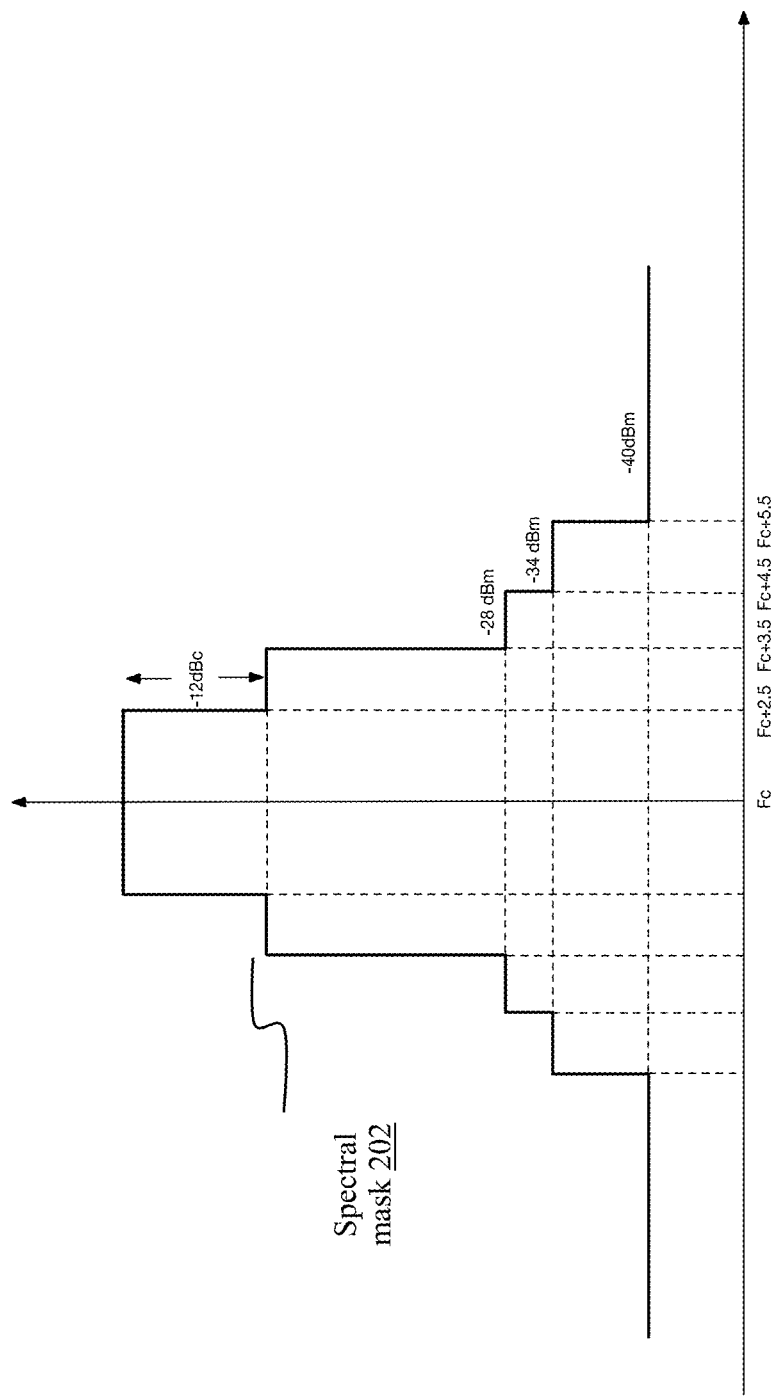
FIG. 2A is a spectral diagram of an embodiment of an enhanced data rate low energy wireless protocol.

FIG. 2A is a spectral diagram of an embodiment of an enhanced data rate low energy wireless protocol. As shown, signal levels may be reduced in sidebands to meet spectral mask 202 in some implementations to reduce interference to neighboring channels. Carrier frequency Fc may be any appropriate frequency and, in some implementations, devices utilizing the protocol may perform dynamic frequency selection to minimize interference and congestion.

Figure 2B:
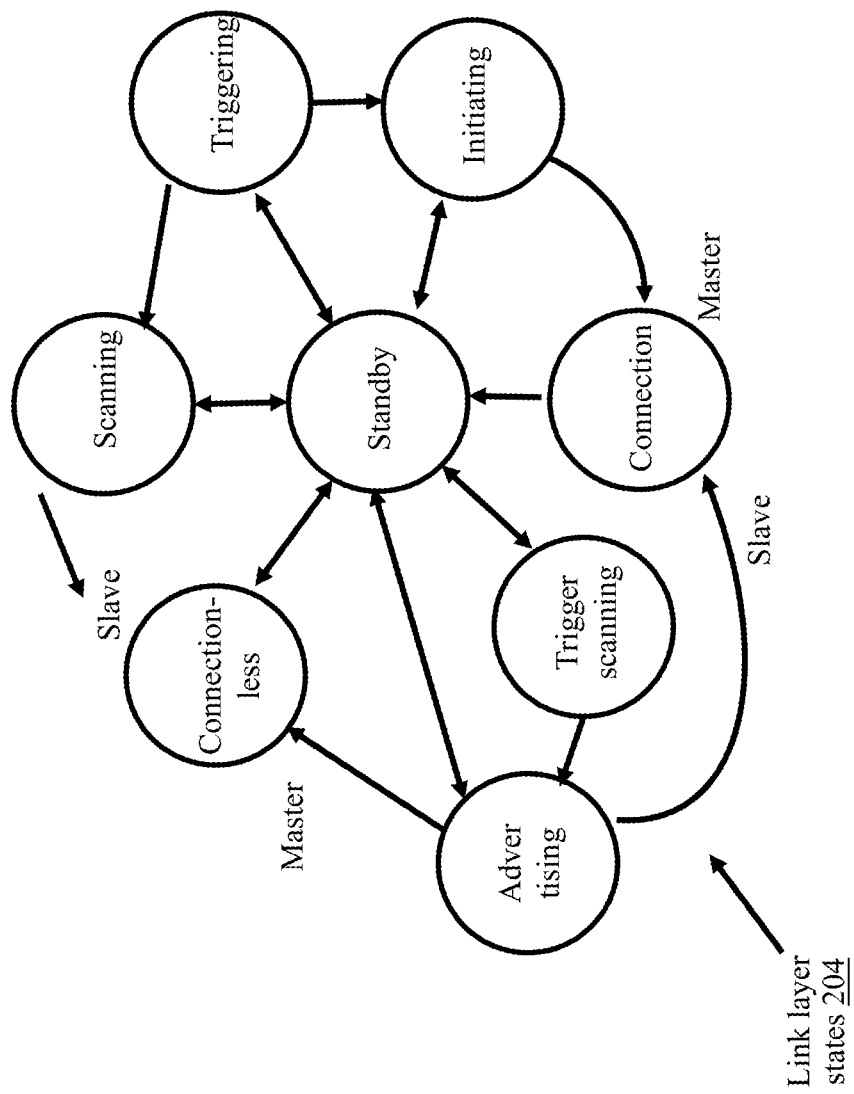
FIG. 2B is a state diagram of an embodiment of an enhanced data rate low energy wireless protocol.

FIG. 2B is a state diagram 204 of an embodiment of an enhanced data rate low energy wireless protocol. As shown, a device may move between a standby state (which may be an initialization or starting state in some implementations) and states for advertising availability, scanning for other devices, a connectionless communication state, and a state of initiating a connection (from which it may proceed to a connected state). A triggering state may be used in some implementations to cause other devices to broadcast identifiers or availability, such devices initially being in a corresponding trigger-scanning state. When a first device is in the trigger-scanning state, upon detection of a triggering broadcast from a second device, the first device may begin broadcasting an advertisement to establish a connection. From that state, it may either act as the master for a connectionless communication session; or as the slave of a connected state. These two resulting states are controlled by the triggering device; after broadcasting its triggering message, it may either begin initiating a connection as master (responding to the advertised broadcast from the first device with connection setup information), or may begin scanning for connectionless-data broadcast by the first device.

In some implementations, predetermined channels may be used for various purposes, including predetermined advertising channels for broadcasting connection availability (e.g. 1 MHz channels on predetermined frequencies), as well as 1 MHz, 2 MHz, 4 MHz, or larger channels within the 2.4 or 5 GHz bands. As discussed above, channel spacing may provide as many as 17 4 MHz data channels within the 2.4 GHz ISM band and 189 4 MHz data channels within the 5 GHz band.

Figure 2C:
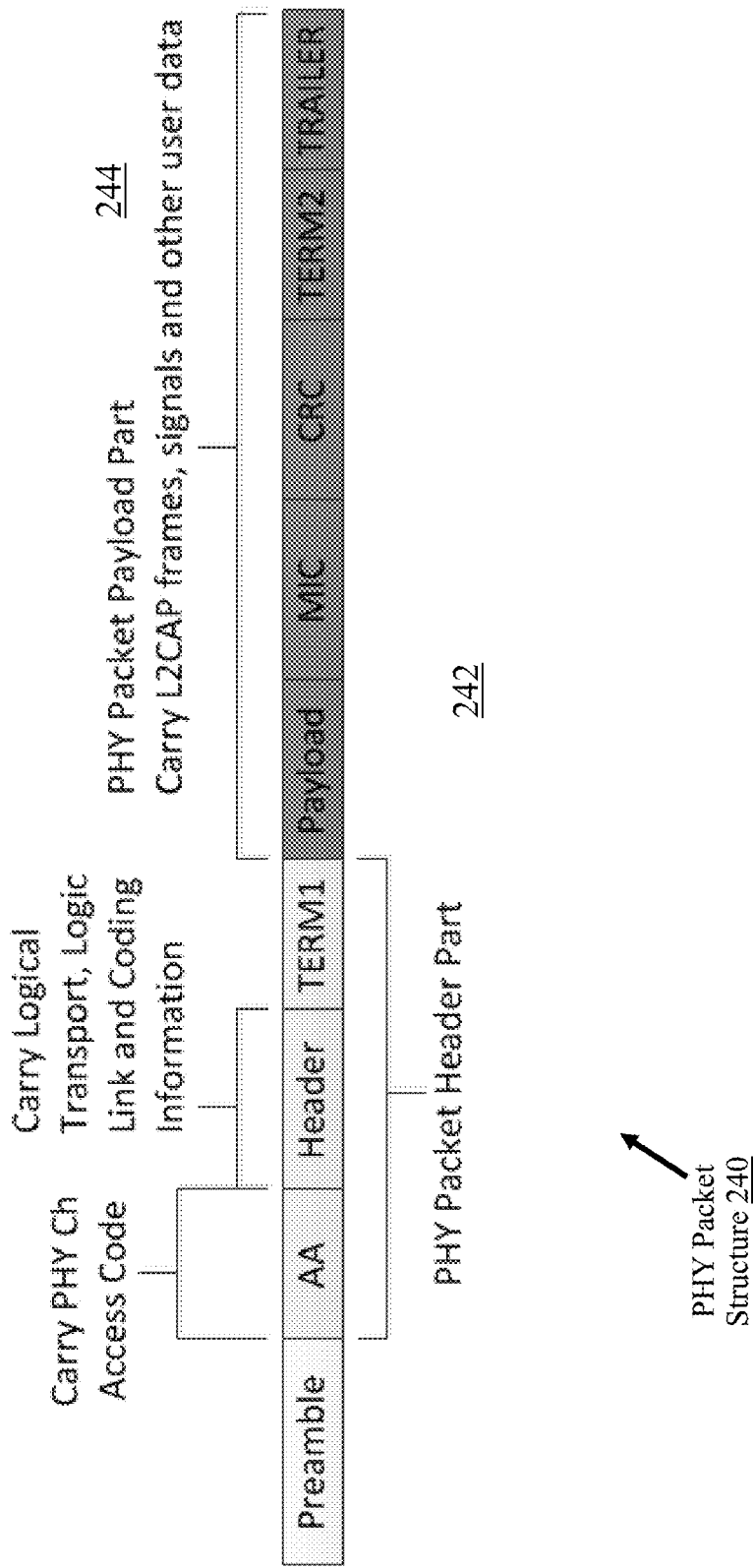
FIG. 2C is a diagram of a packet structure for an embodiment of an enhanced data rate low energy wireless protocol.

FIG. 2C is a diagram of a physical layer packet 240 for an embodiment of an enhanced data rate low energy wireless protocol. As shown the packet may comprise a preamble, physical layer header 242, and physical layer payload 244 (which may, itself, contain higher layer protocol packets within a payload). The packet preamble may comprise predetermined data and be used for identification of the packet beginning and decoder timing. In some implementations, the packet preamble may comprise an 80-bit (10 microsecond) pattern, such as 0011 1100 repeated ten times.

The packet header 242 may include an access address; logical transport, logic, link, and coding information; and termination codes (e.g. a predetermined code, such as 000b). The access address may carry the physical layer channel access code, and may, in some implementations, be of a similar format to an access address used in the Bluetooth LE protocol (e.g. not having more than six consecutive zeroes or ones; not being the advertising channel packets' access address; not being a sequence differing from the advertising channel packets' access address by one bit; not having all four octets equal; not having more than 24 transitions, but having at least two transitions in the most significant six bits, and at least three ones in the least significant eight bits; and no more than eleven transitions in the least significant 16 bits). In other implementations, other conditions may be used. The packet payload 244 may comprise a higher layer payload, which may be of any length (e.g. 0 to 4096 octets or larger in some implementations); message integrity code (MIC); cyclic redundancy check (CRC) code; termination codes (e.g. a predetermined code, such as 000b); and a packet trailer (e.g. a predetermined code, such as 00b). In some implementations and/or packet types, various elements may be removed. For example, for availability advertisement packets, in some implementations, the MIC and/or CRC codes may be omitted. In other implementations, the higher payload may also include CRC codes.

FIG. 2D is a diagram of the header portion of the PHY packet header 242 (i.e. without the access address or termination code) for an advertising packet 260 for an embodiment of an enhanced data rate low energy wireless protocol. The header may include a predetermined access address (which may, in some implementations, be the same as the Bluetooth LE access address of 0x8E89BED6). The fields may be identical to those used in the Bluetooth LE protocol (e.g. packet data unit type field; channel select field; reserved fields (RFU); transmitter address and receiver address flags; and payload length field), with the addition of a CRC Present (CP) flag, coding identification (CI), and Header Error Control (HEC) code. The Coding Identification field may comprise a two-bit field identifying a coding type used from a plurality of predetermined coding types. The HEC field may comprise a checksum of predetermined header fields.

Figure 2E:
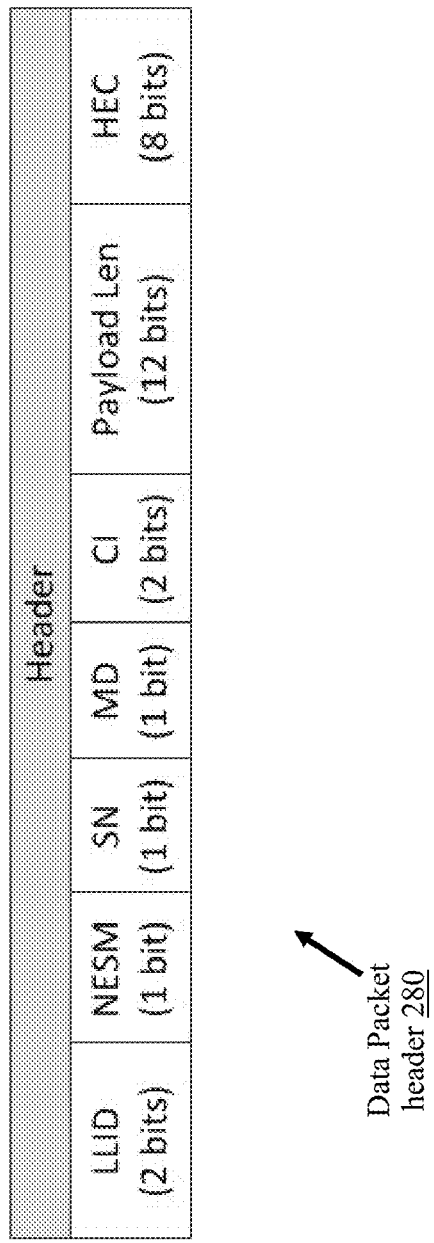

FIG. 2E is a diagram of the header portion of the PHY packet header 242 (i.e. without the access address or termination code) for a data packet 280 for an embodiment of an enhanced data rate low energy wireless protocol. The fields may also be identical to those used in the Bluetooth LE protocol (e.g. link layer ID (LLID) flag; next expected sequence number (NESN) flag; sequence number (SN) flag; more data (MD) flag; and payload length field) with the addition of the CI and HEC codes discussed above.

Figures 3A, 3B:
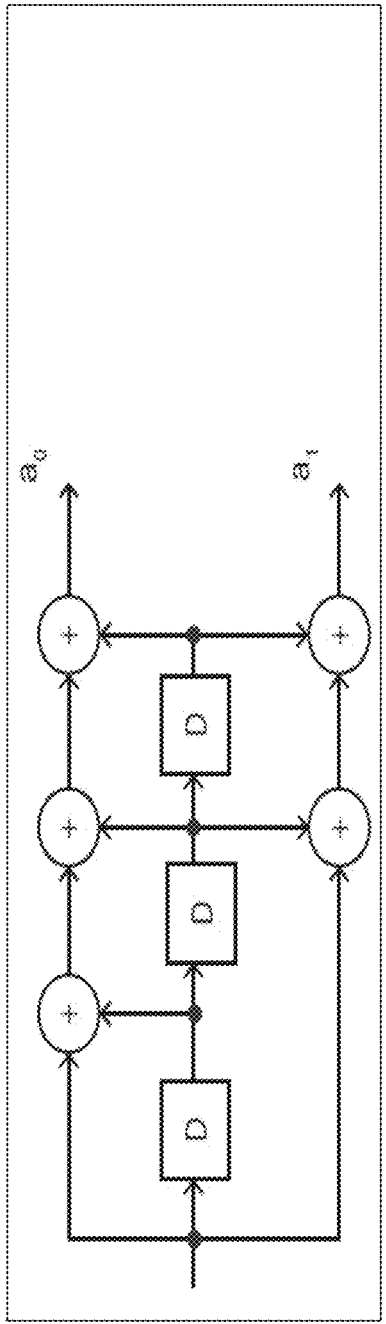
FIG. 3A is a diagram of a forward error correction encoder for an embodiment of an enhanced data rate low energy wireless protocol.
FIG. 3B is a table illustrating output bit patterns from an embodiment of the encoder of FIG. 3A.

FIG. 3A is a diagram of a forward error correction (FEC) encoder 300 for an embodiment of an enhanced data rate low energy wireless protocol. In many implementations, a convolutional encoder may be used as shown, in a similar format to the Bluetooth LE FEC encoder. FIG. 3B is a table illustrating output bit patterns from an embodiment of the encoder of FIG. 3A and corresponding pattern mapping.

Figure 3C:
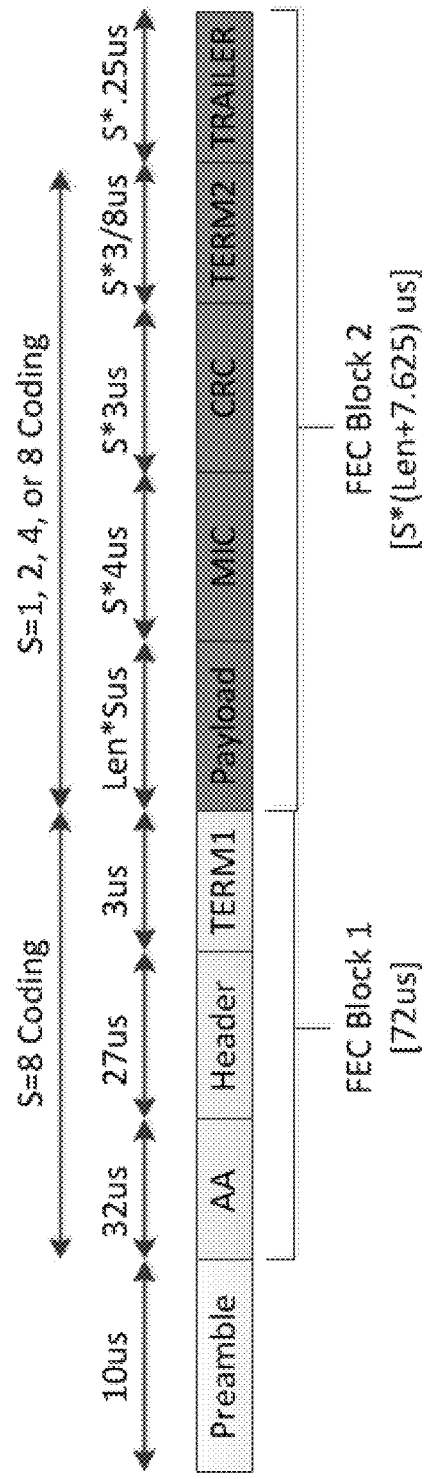
FIG. 3C is a diagram illustrating transmission timing for a packet for an embodiment of an enhanced data rate low energy wireless protocol.

Output bit patterns may be mapped as shown depending on encoding type (e.g. according to coding identifier CI discussed above with regard to packet headers). FIG. 3C is a diagram illustrating transmission timing and FEC blocks for a packet for an embodiment of an enhanced data rate low energy wireless protocol. FEC block 2 may be absent for packets with payload length equal to 0. As discussed above, in some implementations, MIC and/or CRC fields may be omitted, reducing the length of the second FEC block.

Figure 3D:
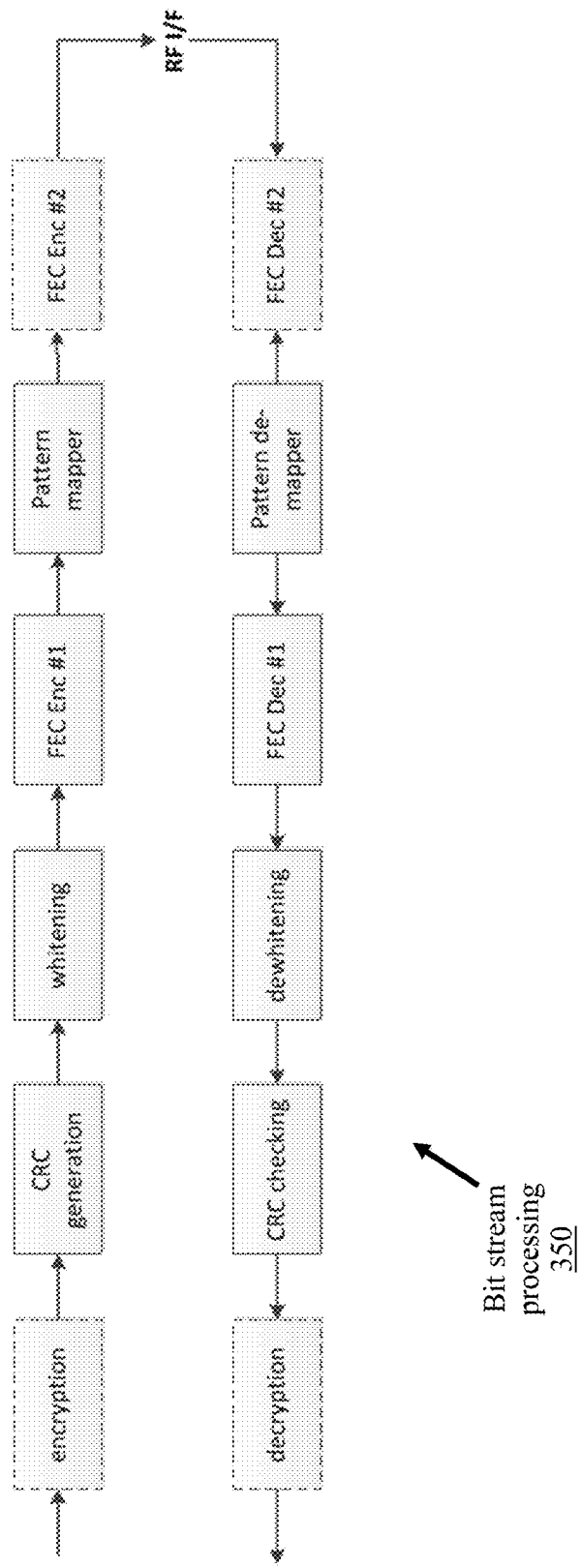
FIG. 3D is a block diagram of bit stream processing for an embodiment of an enhanced data rate low energy wireless protocol.

FIG. 3D is a block diagram of bit stream processing 350 for an embodiment of an enhanced data rate low energy wireless protocol. As shown, data may be optionally encrypted, and CRC codes generated. Data may be whitened (i.e. processed via a whitening transformation) and then provided to an FEC encoder. The FEC encoder may perform FEC convolution for a first block, with the output provided to a pattern mapper, as discussed above with regard to FIGS. 3A and 3B. In some implementations, a second FEC encoder may perform convolution for a second FEC block, if present, as discussed above.

Reversing the process, after transmission and reception, the received data may be provided to an FEC decoder for decoding of the second block if present; and the bitstream may be de-mapped and decoded by the first FEC block decoder. The bitstream may be dewhitened and CRC values checked. If the CRC check indicates no errors, then in some implementations, the data may be decrypted and passed up the network stack of the device.

Figure 3E:
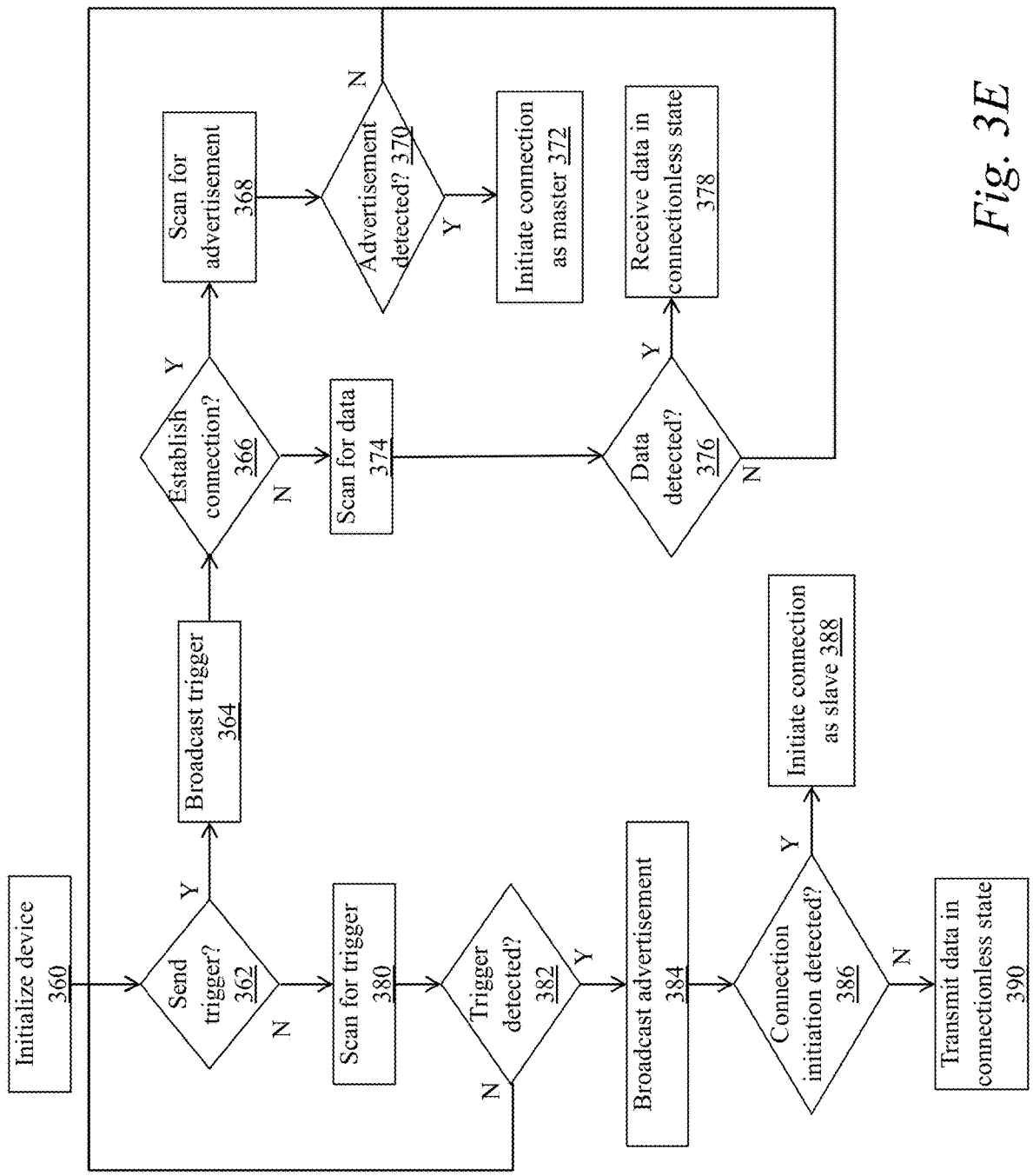
FIG. 3E is a flow chart of a method for communication with an embodiment of an enhanced data rate low energy wireless protocol.

FIG. 3E is a flow chart of a method for communication with an embodiment of an enhanced data rate low energy wireless protocol. At step 360 the device may be initialized, e.g. on startup, reboot, responsive to expiration of a timer (e.g. once an hour, once a day, etc.), or any other such period. Initializing the device may comprise resetting sequence numbers or other identifiers, clearing buffers, or performing other functions to prepare for communications.

At step 362, the device may determine whether to send a trigger. In some implementations, devices may be explicitly configured as trigger-broadcasting or trigger-receiving, or similarly, as master devices or slave devices. In other implementations, devices may perform both functions in sequence—e.g. scanning for a trigger, and if no trigger is detected, then broadcasting a trigger. In some implementations, to prevent a plurality of devices from attempting to broadcast triggers at the same time, devices may be configured with random timers or intervals at which to repeat trigger broadcasts. In other implementations, devices may be configured to broadcast trigger commands and listen for other broadcasts simultaneously, e.g. on the same or another channel or frequency.

At step 364, the device may broadcast a trigger. In some implementations, the device may be considered to be in a triggering state during the broadcast, and cause or trigger other recipient devices to respond to the trigger with connection advertisement data or other such information. The trigger broadcast may comprise a packet as discussed above. In some implementations, one or more fields of the packet may be absent from the trigger packet, e.g. a packet payload may be omitted in some implementations, to reduce the bandwidth required for the trigger packet. In other implementations, all of the fields may be included.

At step 366, the device may determine whether it is to establish a connection or not. In some implementations, the device may not establish a connection if only lightweight data needs to be exchanged (e.g. beacon information, configuration data, status data, short commands, etc.). In such implementations, a connectionless data exchange may occur. In other implementations, the device may establish a connection to allow for more extensive communications, including error correction, retransmission protocols, or other such features.

If the device is to establish a connection, then at step 368, the device may scan for a connection advertisement broadcast by another device in response to receipt of the trigger broadcast. The connection advertisement packet may comprise a packet as discussed above, and may include some or all of the fields discussed above. For example, in some implementations, the connection advertisement packet may not include an error check (e.g. CRC field) or other fields of an error correction block. The advertisement packet may include configuration and/or synchronization information to allow the devices to establish a connection, and may include one or more fields similar to those utilized in other connection establish protocols, such as Bluetooth LE.

At step 370, the device may determine if an advertisement has been detected. In many implementations, the device may wait a predetermined time period or timeout period to detect an advertisement broadcast. If no advertisement is detected, the method may return to step 362 (or step 360 in some implementations).

If an advertisement is detected from another device, then at step 372, the device may initiate a connection with the other device as a master (the other device connecting as a slave). Initiating a connection may comprise performing a handshaking or synchronization procedure or other connection establishment algorithm according to configuration information received in the advertisement (e.g. channel, synchronization values, encryption settings, etc.). The devices may then perform further data exchange.

If at step 366, the device determines to not establish a connection, then at step 374, it may scan or listen for a data broadcast by the other device. The device may scan or listen on a frequency or channel identified by the other device in the broadcast advertisement received in response to the trigger at step 364. As discussed above, in some implementations, connectionless data may be exchanged as a lightweight, low power alternative to data exchange via established connections. The connectionless data exchange may lack retransmission or acknowledgement protocols, but may include sufficient error correction as discussed above to allow the device to successfully and reliably receive data. If data is detected at step 376, then at step 378, the device may receive, buffer, and decode the data. In some implementations, decoding the data may comprise performing error correction, pattern de-mapping, and other features as discussed above in connection with FIG. 3D. Conversely, if data is not detected or received within a predetermined time period, the method may return to step 362. In some implementations, the method may return to step 374 after step 378, e.g. when a connectionless data exchange includes a plurality of packets or blocks transmitted over time.

If the device does not determine to send a trigger broadcast at step 362, then at step 380, it may instead listen for trigger broadcasts from other devices. At step 382, if the device has not received a trigger broadcast within a predetermined period of time, the method may return to step 362. The predetermined period of time or listening or timeout period may be of any duration, such as 1 second, 5 seconds, 10 seconds, or any other such value.

At step 382, if the device receives a trigger broadcast from another device, then in response, at step 384, the device may broadcast a connection advertisement, as discussed above. The connection advertisement may comprise sufficient details to allow connection establishment, including channel selection, synchronization numbers, signal strength or noise measurements, or any other type and form of information.

At step 386, the device may listen for a connection initiation packet or start of a handshaking procedure from the other device with information corresponding to the information provided in the connection advertisement. If this information is received, then at step 388, the device may establish the connection as a slave, performing any necessary parts of the handshaking protocol (e.g. transmitting acknowledgement packets, synchronization packets, or any other type and form of handshaking or authentication).

Conversely, if no connection initiation is detected from the other device, then in some implementations, at step 390, the device may transmit data in a connectionless state to the other device. This data may be preselected, such as further configuration or status information, environmental measurements (e.g. received signal strength, noise, packet loss, latency, etc.) or any other type and form of information. In some implementations, the method may then return to step 362 (or step 360).

As discussed above, in some implementations, connection initiation and/or connectionless data exchange may be entered into directly without proceeding through trigger broadcasting and/or trigger scanning states. However, in many implementations, the trigger broadcast and scanning processes may provide an efficient low-energy and lightweight process for bringing devices from standby into a data exchange-ready state.

In some implementations, throughput may be further increased by increasing bandwidth, e.g. from n MHz to multiples of n MHz. For example, data from multiple devices may be multiplexed within the expanded bandwidth. Additionally, the systems discussed herein may operate on any available frequency band, and thus may include a software defined radio (SDR) configurable to operate in any available band (e.g. various ISM bands).

Thus, in one aspect, the present disclosure is directed to a system for enhanced data rate low energy wireless communications. The system includes a first device comprising wireless communications circuitry configured to: in a first state, broadcast a triggering command and monitor a wireless communication medium for a connection advertisement response from a second device; and in response to receiving the connection advertisement response within a predetermined time period, initiate data communications with the second device, or in response to not receiving the connection advertisement response within the predetermined time period, in a second state, monitor the wireless communication medium for a second triggering command broadcast by another device.

In some implementations, the wireless communications circuitry is further configured to, in response to receiving the connection advertisement response within the predetermined time period, initiate data communications with the second device by performing a connection establishment protocol via the wireless communication medium. In some implementations, the wireless communications circuitry is further configured to, in response to receiving the connection advertisement response within the predetermined time period, initiate data communications with the second device by monitoring the wireless communication medium for a connectionless data transmission. In a further implementation, the wireless communications circuitry is further configured to receive the connectionless data transmission without transmitting an acknowledgement via the wireless communication medium.

In some implementations, the wireless communications circuitry is further configured to, in the second state, receive the second triggering command broadcast by the other device, and, responsive to receipt of the second triggering command, broadcast a connection advertisement response via the wireless communication medium. In some implementations, the wireless communications circuitry further comprises a bitstream processor configured to transmit data via a π/4-differential quadrature phase shift keying. In a further implementation, the bitstream processor comprises a forward error correction encoder, and a pattern mapper configured to receive an input bit from the forward error correction encoder and map the input bit to a predetermined output pattern. In a still further implementation, the bitstream processor further comprises a second forward error correction encoder configured to receive the pattern mapped bitstream, and provide a packet comprising two forward error correction blocks.

In another aspect, the present disclosure is directed to a method for enhanced data rate low energy wireless communications. The method includes broadcasting, by wireless communication circuitry of a first device, a triggering command via a wireless communication medium. The method also includes monitoring, by the wireless communication circuitry, the wireless communication medium for a connection advertisement response from a second device; and in response to receiving the connection advertisement response within a predetermined time period, initiating data communications, by the wireless communication circuitry, with the second device, or in response to not receiving the connection advertisement response within the predetermined time period, monitoring, by the wireless communication circuitry, the wireless communication medium for a second triggering command broadcast by another device.

In some implementations, the method includes initiating data communications with the second device by performing a connection establishment protocol via the wireless communication medium in response to receiving the connection advertisement response within the predetermined time period. In some implementations, the method includes initiating data communications with the second device by monitoring the wireless communication medium for a connectionless data transmission, in response to receiving the connection advertisement response within the predetermined time period. In a further implementation, monitoring the wireless communication medium for a connectionless data transmission includes receiving the connectionless data transmission without transmitting an acknowledgement via the wireless communication medium.

In some implementations, monitoring the wireless communication medium for a second triggering command includes: receiving the second triggering command broadcast by the other device; and responsive to receipt of the second triggering command, broadcasting a connection advertisement response via the wireless communication medium. In some implementations, the method includes transmitting, by a bitstream processor of the first device, data via a π/4-differential quadrature phase shift keying. In a further implementation, the method includes performing forward error correction, by the bitstream processor, on an input data stream; and mapping an input bit of the forward error correction to a predetermined output pattern, by a pattern mapper of the bitstream processor. In a still further implementation, the method includes performing a second forward error correction on the output of the pattern mapper to generate a packet comprising two forward error correction blocks.

In still another aspect, the present disclosure is directed to a system for enhanced data rate low energy wireless communications. The system includes a first device comprising wireless communications circuitry configured to: in a first state, monitor a wireless communication medium for a triggering command transmitted by a second device; and responsive to receipt of the triggering command, transmit a connection advertisement response to a second device via the wireless communication medium, receipt of the connection advertisement response causing the second device to initiate data communications with the first device.

In some implementations, the wireless communications circuitry is further configured to utilize $\pi/4$-differential quadrature phase shift keying for data communications with the second device. In some implementations, the wireless communications circuitry is further configured to transmit data in a connectionless state to the second device. In a further implementation, the wireless communications circuitry is further configured to transmit data in the connectionless state, responsive to not receiving a connection establishment request from the second device within a predetermined period.

Figure 4A:
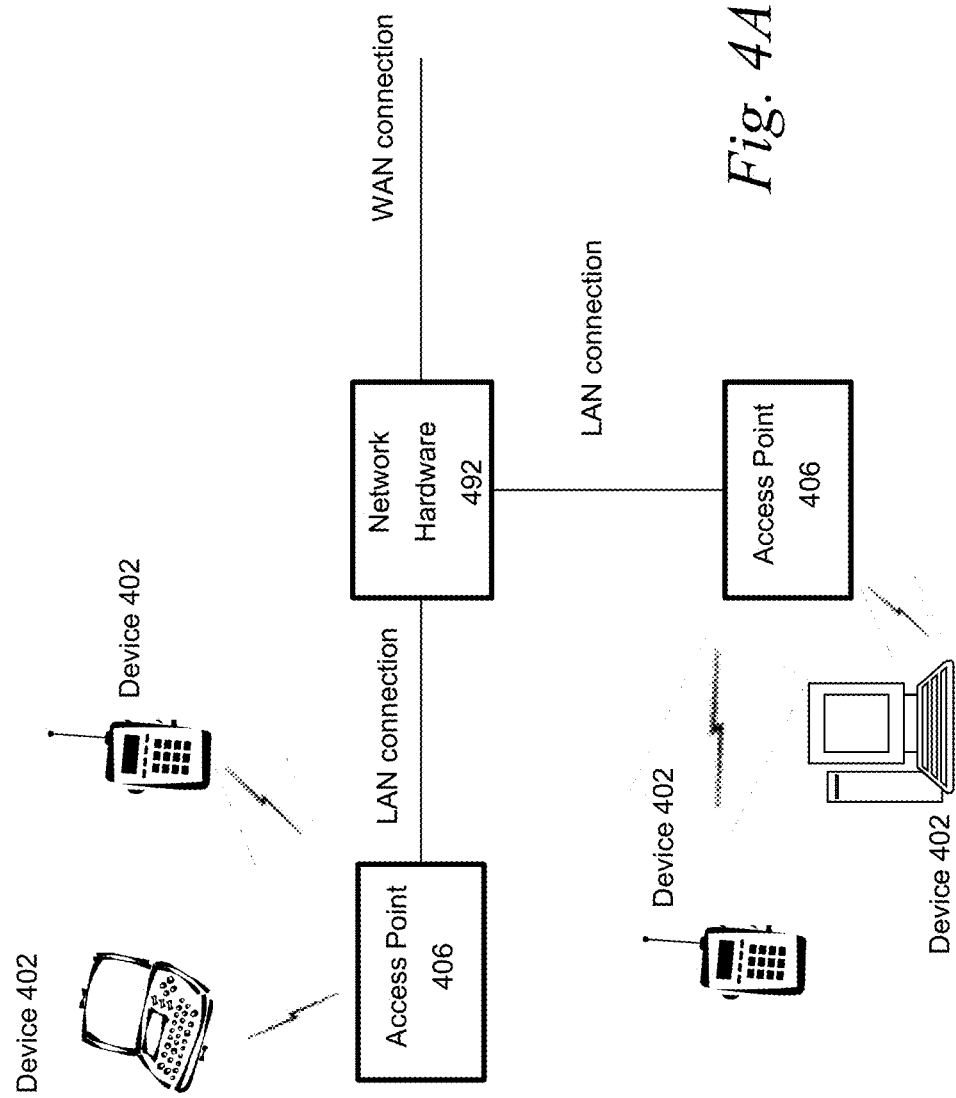
FIG. 4A is a block diagram depicting an embodiment of a network environment including one or more access points in communication with one or more devices or stations.

Having discussed specific embodiments of the present solution, it may be helpful to describe aspects of the operating environment as well as associated system components (e.g., hardware elements) in connection with the methods and systems described herein. Referring to FIG. 4A, an embodiment of a network environment is depicted. In brief overview, the network environment includes a wireless communication system that includes one or more access points 406, one or more wireless communication devices 402 and a network hardware component 492. The wireless communication devices 402 may for example include laptop computers 402, tablets 402, personal computers 402 and/or cellular telephone devices 402. The details of an embodiment of each wireless communication device and/or access point are described in greater detail with reference to FIGS. 4B and 4C. The network environment can be an ad hoc network environment, an infrastructure wireless network environment, a subnet environment, etc. in one embodiment The access points (APs) 406 may be operably coupled to the network hardware 492 via local area network connections. The network hardware 492, which may include a router, gateway, switch, bridge, modem, system controller, appliance, etc., may provide a local area network connection for the communication system. Each of the access points 406 may have an associated antenna or an antenna array to communicate with the wireless communication devices 402 in its area. The wireless communication devices 402 may register with a particular access point 406 to receive services from the communication system (e.g., via a SU-MIMO or MU-MIMO configuration). For direct connections (e.g., point-to-point communications), some wireless communication devices 402 may communicate directly via an allocated channel and communications protocol. Some of the wireless communication devices 402 may be mobile or relatively static with respect to the access point 406.

In some embodiments an access point 406 includes a device or module (including a combination of hardware and software) that allows wireless communication devices 402 to connect to a wired network using Wi-Fi, or other standards. An access point 406 may sometimes be referred to as an wireless access point (WAP). An access point 406 may be configured, designed and/or built for operating in a wireless local area network (WLAN). An access point 406 may connect to a router (e.g., via a wired network) as a standalone device in some embodiments. In other embodiments, an access point can be a component of a router. An access point 406 can provide multiple devices 402 access to a network. An access point 406 may, for example, connect to a wired Ethernet connection and provide wireless connections using radio frequency links for other devices 402 to utilize that wired connection. An access point 406 may be built and/or configured to support a standard for sending and receiving data using one or more radio frequencies. Those standards, and the frequencies they use may be defined by the IEEE (e.g., IEEE 802.11 standards). An access point may be configured and/or used to support public Internet hotspots, and/or on an internal network to extend the network's Wi-Fi signal range.

In some embodiments, the access points 406 may be used for (e.g., in-home or in-building) wireless networks (e.g., IEEE 802.11, Bluetooth, ZigBee, any other type of radio frequency based network protocol and/or variations thereof). Each of the wireless communication devices 402 may include a built-in radio and/or is coupled to a radio. Such wireless communication devices 402 and/or access points 406 may operate in accordance with the various aspects of the disclosure as presented herein to enhance performance, reduce costs and/or size, and/or enhance broadband applications. Each wireless communication devices 402 may have the capacity to function as a client node seeking access to resources (e.g., data, and connection to networked nodes such as servers) via one or more access points 406.

The network connections may include any type and/or form of network and may include any of the following: a point-to-point network, a broadcast network, a telecommunications network, a data communication network, a computer network. The topology of the network may be a bus, star, or ring network topology. The network may be of any such network topology as known to those ordinarily skilled in the art capable of supporting the operations described herein. In some embodiments, different types of data may be transmitted via different protocols. In other embodiments, the same types of data may be transmitted via different protocols.

Figure 4B:
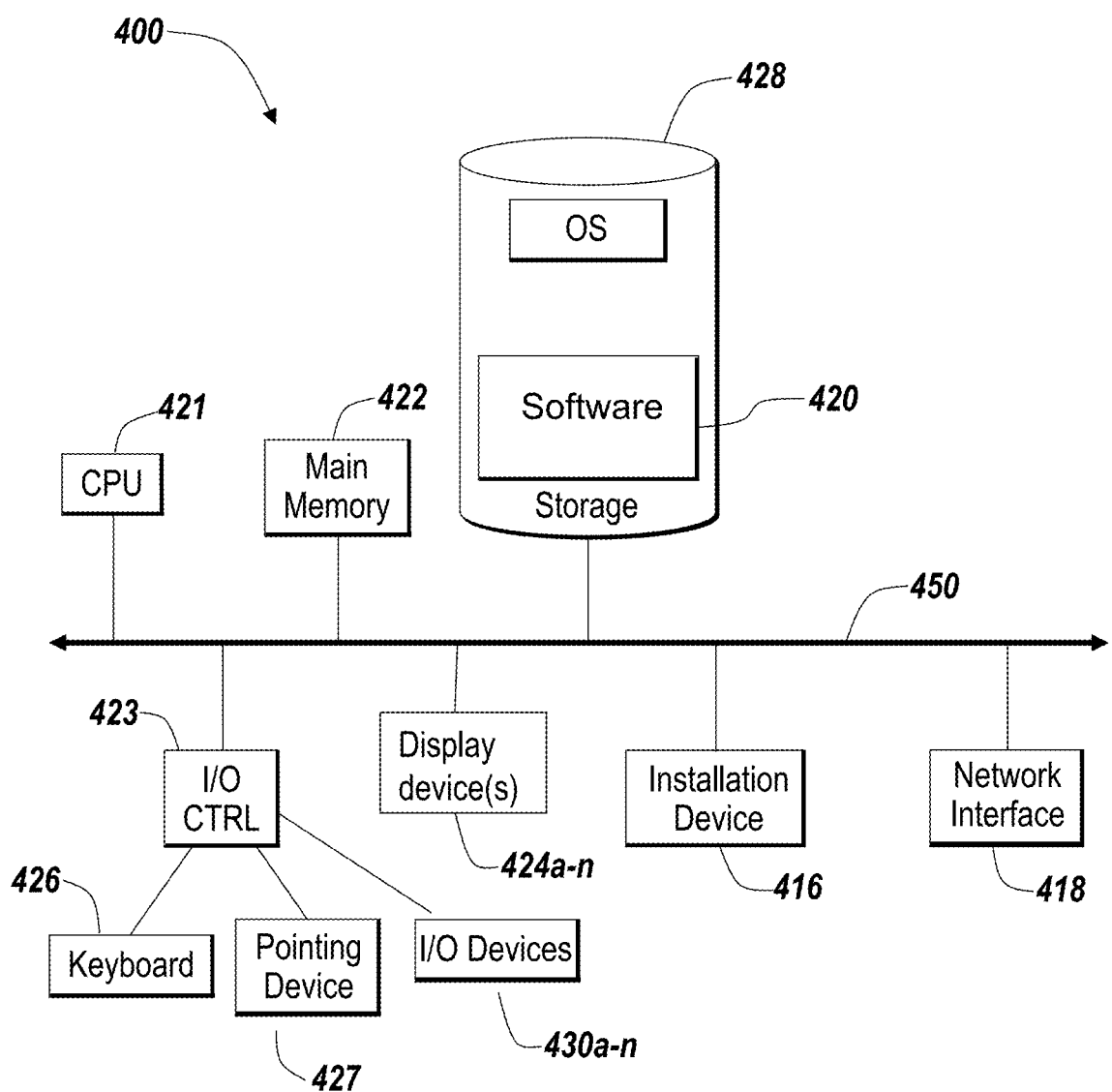
FIGS. 4B and 4C are block diagrams depicting embodiments of computing devices useful in connection with the methods and systems described herein.
Figure 4C:
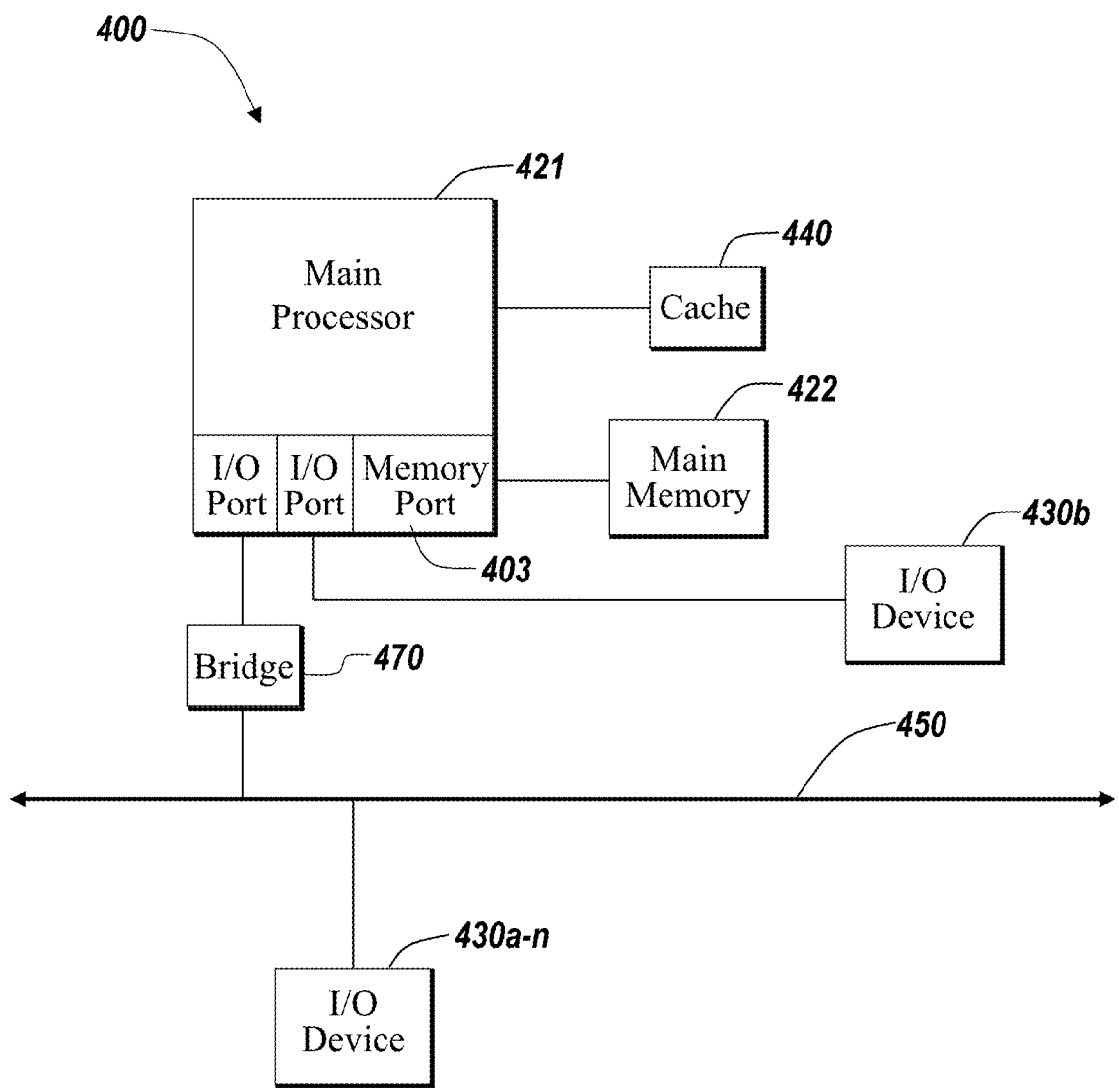

The communications device(s) 402 and access point(s) 406 may be deployed as and/or executed on any type and form of computing device, such as a computer, network device or appliance capable of communicating on any type and form of network and performing the operations described herein. FIGS. 4B and 4C depict block diagrams of a computing device 400 useful for practicing an embodiment of the wireless communication devices 402 or the access point 406. As shown in FIGS. 4B and 4C, each computing device 400 includes a central processing unit 421, and a main memory unit 422. As shown in FIG. 4B, a computing device 400 may include a storage device 428, an installation device 416, a network interface 418, an I/O controller 423, display devices 424a-424n, a keyboard 426 and a pointing device 427, such as a mouse. The storage device 428 may include, without limitation, an operating system and/or software. As shown in FIG. 4C, each computing device 400 may also include additional optional elements, such as a memory port 403, a bridge 470, one or more input/output devices 430a-430n (generally referred to using reference numeral 430), and a cache memory 440 in communication with the central processing unit 421.

The central processing unit 421 is any logic circuitry that responds to and processes instructions fetched from the main memory unit 422. In many embodiments, the central processing unit 421 is provided by a microprocessor unit, such as: those manufactured by Intel Corporation of Mountain View, Calif.; those manufactured by International Business Machines of White Plains, N.Y.; or those manufactured by Advanced Micro Devices of Sunnyvale, Calif. The computing device 400 may be based on any of these processors, or any other processor capable of operating as described herein.

Main memory unit 422 may be one or more memory chips capable of storing data and allowing any storage location to be directly accessed by the microprocessor 421, such as any type or variant of Static random access memory (SRAM), Dynamic random access memory (DRAM), Ferroelectric RAM (FRAM), NAND Flash, NOR Flash and Solid State Drives (SSD). The main memory 422 may be based on any of the above described memory chips, or any other available memory chips capable of operating as described herein. In the embodiment shown in FIG. 4B, the processor 421 communicates with main memory 422 via a system bus 450 (described in more detail below). FIG. 4C depicts an embodiment of a computing device 400 in which the processor communicates directly with main memory 422 via a memory port 403. For example, in FIG. 4C the main memory 422 may be DRDRAM.

FIG. 4C depicts an embodiment in which the main processor 421 communicates directly with cache memory 440 via a secondary bus, sometimes referred to as a backside bus. In other embodiments, the main processor 421 communicates with cache memory 440 using the system bus 450. Cache memory 440 typically has a faster response time than main memory 422 and is provided by, for example, SRAM, BSRAM, or EDRAM. In the embodiment shown in FIG. 4C, the processor 421 communicates with various I/O devices 430 via a local system bus 450. Various buses may be used to connect the central processing unit 421 to any of the I/O devices 430, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 424, the processor 421 may use an Advanced Graphics Port (AGP) to communicate with the display 424. FIG. 4C depicts an embodiment of a computer 400 in which the main processor 421 may communicate directly with I/O device 430b, for example via HYPERTRANSPORT, RAPIDIO, or INFINIBAND communications technology. FIG. 4C also depicts an embodiment in which local busses and direct communication are mixed: the processor 421 communicates with I/O device 430a using a local interconnect bus while communicating with I/O device 430b directly.

A wide variety of I/O devices 430a-430n may be present in the computing device 400. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices may be controlled by an I/O controller 423 as shown in FIG. 4B. The I/O controller may control one or more I/O devices such as a keyboard 426 and a pointing device 427, e.g., a mouse or optical pen. Furthermore, an I/O device may also provide storage and/or an installation medium 416 for the computing device 400. In still other embodiments, the computing device 400 may provide USB connections (not shown) to receive handheld USB storage devices such as the USB Flash Drive line of devices manufactured by Twintech Industry, Inc. of Los Alamitos, Calif.

Referring again to FIG. 4B, the computing device 400 may support any suitable installation device 416, such as a disk drive, a CD-ROM drive, a CD-R/RW drive, a DVD-ROM drive, a flash memory drive, tape drives of various formats, USB device, hard-drive, a network interface, or any other device suitable for installing software and programs.

The computing device 400 may further include a storage device, such as one or more hard disk drives or redundant arrays of independent disks, for storing an operating system and other related software, and for storing application software programs such as any program or software 420 for implementing (e.g., configured and/or designed for) the systems and methods described herein. Optionally, any of the installation devices 416 could also be used as the storage device. Additionally, the operating system and the software can be run from a bootable medium.

Furthermore, the computing device 400 may include a network interface 418 to interface to the network 404 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 400 communicates with other computing devices 400' via any type and/or form of gateway or tunneling protocol such as Secure Socket Layer (SSL) or Transport Layer Security (TLS). The network interface 418 may include a built-in network adapter, network interface card, PCMCIA network card, card bus network adapter, wireless network adapter, USB network adapter, modem or any other device suitable for interfacing the computing device 400 to any type of network capable of communication and performing the operations described herein.

In some embodiments, the computing device 400 may include or be connected to one or more display devices 424a-424n. As such, any of the I/O devices 430a-430n and/or the I/O controller 423 may include any type and/or form of suitable hardware, software, or combination of hardware and software to support, enable or provide for the connection and use of the display device(s) 424a-424n by the computing device 400. For example, the computing device 400 may include any type and/or form of video adapter, video card, driver, and/or library to interface, communicate, connect or otherwise use the display device(s) 424a-424n. In one embodiment, a video adapter may include multiple connectors to interface to the display device(s) 424a-424n. In other embodiments, the computing device 400 may include multiple video adapters, with each video adapter connected to the display device(s) 424a-424n. In some embodiments, any portion of the operating system of the computing device 400 may be configured for using multiple displays 424a-424n. One ordinarily skilled in the art will recognize and appreciate the various ways and embodiments that a computing device 400 may be configured to have one or more display devices 424a-424n.

In further embodiments, an I/O device 430 may be a bridge between the system bus 450 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 400 of the sort depicted in FIGS. 4B and 4C may operate under the control of an operating system, which control scheduling of tasks and access to system resources. The computing device 400 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Wash.; MAC OS, produced by Apple Computer of Cupertino, Calif.; WebOS, produced by Research In Motion (RIM); OS/2, produced by International Business Machines of Armonk, N.Y.; and Linux, a freely-available operating system distributed by Caldera Corp. of Salt Lake City, Utah, or any type and/or form of a Unix operating system, among others.

The computer system 400 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. The computer system 400 has sufficient processor power and memory capacity to perform the operations described herein.

In some embodiments, the computing device 400 may have different processors, operating systems, and input devices consistent with the device. For example, in one embodiment, the computing device 400 is a smart phone, mobile device, tablet or personal digital assistant. In still other embodiments, the computing device 400 is an Android-based mobile device, an iPhone smart phone manufactured by Apple Computer of Cupertino, Calif., or a Blackberry or WebOS-based handheld device or smart phone, such as the devices manufactured by Research In Motion Limited. Moreover, the computing device 400 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Although the disclosure may reference one or more "users", such "users" may refer to user-associated devices or stations (STAs), for example, consistent with the terms "user" and "multi-user" typically used in the context of a multi-user multiple-input and multiple-output (MU-MIMO) environment.

Although examples of communications systems described above may include devices and APs operating according to an 802.11 standard, it should be understood that embodiments of the systems and methods described can operate according to other standards and use wireless communications devices other than devices configured as devices and APs. For example, multiple-unit communication interfaces associated with cellular networks, satellite communications, vehicle communication networks, and other non-802.11 wireless networks can utilize the systems and methods described herein to achieve improved overall capacity and/or link quality without departing from the scope of the systems and methods described herein.

It should be noted that certain passages of this disclosure may reference terms such as "first" and "second" in connection with devices, mode of operation, transmit chains, antennas, etc., for purposes of identifying or differentiating one from another or from others. These terms are not intended to merely relate entities (e.g., a first device and a second device) temporally or according to a sequence, although in some cases, these entities may include such a relationship. Nor do these terms limit the number of possible entities (e.g., devices) that may operate within a system or environment.

It should be understood that the systems described above may provide multiple ones of any or each of those components and these components may be provided on either a standalone machine or, in some embodiments, on multiple machines in a distributed system. In addition, the systems and methods described above may be provided as one or more computer-readable programs or executable instructions embodied on or in one or more articles of manufacture. The article of manufacture may be a floppy disk, a hard disk, a CD-ROM, a flash memory card, a PROM, a RAM, a ROM, or a magnetic tape. In general, the computer-readable programs may be implemented in any programming language, such as LISP, PERL, C, C++, C#, PROLOG, or in any byte code language such as JAVA. The software programs or executable instructions may be stored on or in one or more articles of manufacture as object code.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

We claim:

1. A system for wireless communications, comprising:
 a first device comprising wireless communications circuitry configured to:
  in a first state, broadcast a first triggering command, the first triggering command instructing a second device to broadcast a first connection advertisement response for establishing first data communications with the second device and monitor a wireless communication medium for the first connection advertisement response from the second device;
  in response to receiving the first connection advertisement response from the second device within a predetermined time period, initiate the first data communications with the second device according to the first connection advertisement response; and
  in response to not receiving the first connection advertisement response from the second device within the predetermined time period, in a second state, monitor the wireless communication medium for a second triggering command broadcast by another device, the second triggering command instructing the first device to broadcast a second connection advertisement response for establishing second data communications with the first device.

2. The system of claim 1, wherein the wireless communications circuitry is further configured to, in response to receiving the first connection advertisement response from the second device within the predetermined time period, initiate the first data communications with the second device by performing a connection establishment protocol via the wireless communication medium, according to the first connection advertisement response.

3. The system of claim 1, wherein the wireless communications circuitry is further configured to, in response to receiving the first connection advertisement response from the second device within the predetermined time period, initiate the first data communications with the second device by monitoring the wireless communication medium for a connectionless data transmission, according to the first connection advertisement response.

4. The system of claim 3, wherein the wireless communications circuitry is further configured to receive the connectionless data transmission without transmitting an acknowledgement via the wireless communication medium.

5. The system of claim 1,
wherein, in the first state, the first device is a master of the first data communications and the second device is a slave of the first data communications, and
wherein, in the second state, the first device is a slave of the second data communications and the other device is a master of the second data communications.

6. The system of claim 1, wherein the wireless communications circuitry further comprises a bitstream processor configured to transmit data via a π/4-differential quadrature phase shift keying.

7. The system of claim 6, wherein the bitstream processor comprises a first forward error correction encoder configured to perform forward error correction on an input data stream, and a pattern mapper configured to map an output of the forward error correction from the first forward error correction encoder to a patterned mapped bitstream according to a predetermined pattern.

8. The system of claim 7, wherein the bitstream processor further comprises a second forward error correction encoder configured to receive the pattern mapped bitstream, and provide a packet comprising two forward error correction blocks.

9. A method for wireless communications, comprising:
broadcasting, by wireless communication circuitry of a first device, a first triggering command via a wireless communication medium, the first triggering command instructing a second device to broadcast a first connection advertisement response for establishing first data communications with the second device;
monitoring, by the wireless communication circuitry, the wireless communication medium for the first connection advertisement response from the second device;
in response to receiving the first connection advertisement response from the second device within a predetermined time period, initiating the first data communications, by the wireless communication circuitry, with the second device according to the first connection advertisement response; and
in response to not receiving the first connection advertisement response from the second device within the predetermined time period, monitoring, by the wireless communication circuitry, the wireless communication medium for a second triggering command broadcast by another device, the second triggering command instructing the first device to broadcast a second connection advertisement response for establishing second data communications with the first device.

10. The method of claim 9, wherein initiating the first data communications with the second device further comprises performing a connection establishment protocol via the wireless communication medium according to the first connection advertisement response, in response to receiving the first connection advertisement response from the second device within the predetermined time period.

11. The method of claim 9, wherein initiating the first data communications with the second device further comprises monitoring the wireless communication medium for a connectionless data transmission according to the first connection advertisement response, in response to receiving the first connection advertisement response from the second device within the predetermined time period.

12. The method of claim 11, wherein monitoring the wireless communication medium for the connectionless data transmission further comprises receiving the connectionless data transmission without transmitting an acknowledgement via the wireless communication medium.

13. The method of claim 9, further comprising:
receiving the second triggering command broadcast by the other device; and
responsive to receipt of the second triggering command, broadcasting the second connection advertisement response for establishing second data communications via the wireless communication medium.

14. The method of claim 9, further comprising transmitting, by a bitstream processor of the first device, data via a π/4-differential quadrature phase shift keying.

15. The method of claim 14, further comprising performing forward error correction, by the bitstream processor, on an input data stream; and mapping, by the bitstream processor, an output of the forward error correction to a patterned mapped bitstream according to a predetermined output pattern.

16. The method of claim 15, further comprising performing a second forward error correction on the patterned mapped bitstream to generate a packet comprising two forward error correction blocks.

17. A system for wireless communications, comprising:
a first device comprising wireless communications circuitry configured to:
in a first state, monitor a wireless communication medium for a first triggering command transmitted by a second device, the first triggering command instructing the first device to transmit a first connection advertisement response for establishing first data communications with the first device;
responsive to receipt of the first triggering command within a predetermined time period, transmit the first connection advertisement response to a second device via the wireless communication medium, receipt of the first connection advertisement response causing the second device to initiate the first data communications with the first device according to the first connection advertisement response; and
responsive to not receiving the first triggering command within the predetermined time period, broadcast a second triggering command instructing another device to broadcast a second connection advertisement response for establishing second data communications with the other device.

18. The system of claim 17, wherein the wireless communications circuitry is further configured to utilize π/4-differential quadrature phase shift keying for the first data communications with the second device.

19. The system of claim 17, wherein the wireless communications circuitry is further configured to transmit data in a connectionless state to the second device.

20. The system of claim 19, wherein the wireless communications circuitry is further configured to transmit data in the connectionless state, responsive to not receiving a connection establishment request from the second device within a predetermined period.

\* \* \* \* \*